(12) United States Patent
Huang et al.

(10) Patent No.: US 10,473,853 B2
(45) Date of Patent: Nov. 12, 2019

(54) FULLY INTEGRATED AVALANCHE PHOTODIODE RECEIVER

(71) Applicant: SiFotonics Technologies Co., Ltd., Grand Cayman (KY)

(72) Inventors: Mengyuan Huang, Beijing (CN); Tzung-I Su, Taoyuan (TW); Su Li, Beijing (CN); Naichuan Zhang, Beijing (CN); Pengfei Cai, Beijing (CN); Wang Chen, Beijing (CN); Ching-yin Hong, Lexington, MA (US); Dong Pan, Andover, MA (US)

(73) Assignee: SiFotonics Technologies Co., Ltd., Grand Cayman (KY)

( * ) Notice: Subject to any disclaimer, the term of this patent is extended or adjusted under 35 U.S.C. 154(b) by 0 days.

(21) Appl. No.: 15/850,079

(22) Filed: Dec. 21, 2017

(65) Prior Publication Data

US 2018/0180805 A1 Jun. 28, 2018

Related U.S. Application Data

(60) Provisional application No. 62/498,363, filed on Dec. 22, 2016.

(51) Int. Cl.
| | |
|---|---|
| *G02B 6/12* | (2006.01) |
| *G02B 6/122* | (2006.01) |
| *H01L 31/107* | (2006.01) |
| *H01L 27/144* | (2006.01) |
| *H01L 31/02* | (2006.01) |
| *G02B 6/136* | (2006.01) |
| *H01L 49/02* | (2006.01) |

(52) U.S. Cl.
CPC ......... *G02B 6/122* (2013.01); *G02B 6/12004* (2013.01); *G02B 6/136* (2013.01); *H01L 27/1443* (2013.01); *H01L 31/02005* (2013.01); *H01L 31/02027* (2013.01); *H01L 31/1075* (2013.01); *G02B 2006/12061* (2013.01); *G02B 2006/12123* (2013.01); *H01L 28/24* (2013.01); *H01L 28/40* (2013.01)

(58) Field of Classification Search
CPC .... G02B 6/13; G02B 6/122; G02B 2006/121; G02B 2006/12123; H01L 31/105; H01L 29/808; H01L 29/8605; H01L 31/02164; H01L 31/103
USPC .......................................... 385/14, 129–132
See application file for complete search history.

(56) References Cited

U.S. PATENT DOCUMENTS

| | | | |
|---|---|---|---|
| 2007/0152289 A1* | 7/2007 | Morse | H01L 31/028 257/431 |
| 2012/0057816 A1* | 3/2012 | Krasulick | G02B 6/12 385/14 |
| 2016/0043262 A1* | 2/2016 | Okumura | H01L 31/105 257/184 |

* cited by examiner

*Primary Examiner* — Kaveh C Kianni
*Assistant Examiner* — Hung Q Lam
(74) *Attorney, Agent, or Firm* — Han IP PLLC; Andy M. Han

(57) ABSTRACT

Various embodiments of a fully integrated avalanche photodiode receiver and manufacturing method thereof are described herein. A photonic device includes a silicon-on-insulator (SOI) substrate with a buried oxide (BOX) layer therein, an avalanche photodiode integrated with the SOI substrate, a capacitor integrated with the SOI substrate, a resistor integrated with the SOI substrate, and silicon passive waveguides as well as bonding pads integrated with the SOI substrate.

19 Claims, 4 Drawing Sheets

FULLY INTEGRATED AVALANCHE PHOTODIODE RECEIVER

CROSS-REFERENCE TO RELATED PATENT APPLICATIONS

The present disclosure claims the priority benefit of U.S. Patent Application No. 62/498,363, filed on Dec. 22, 2016. The aforementioned applications are incorporated by reference in its entirety.

TECHNICAL FIELD

The present disclosure relates to photonic devices. More particularly, the present disclosure relates to an avalanche photodiode receiver.

BACKGROUND

For high speed operations (such as 25 Gb/s, 50 Gb/s and beyond), surface illuminated devices cannot meet both high responsivity and high bandwidth simultaneously. Typically, photonic device (e.g., avalanche photodiode) uses bonding wire to connect its pad and passive component (e.g., capacitor), which is similar as that shown in FIG. 4. For high speed (e.g., 25 Gb/s) operation, long bonding wire (e.g., length=1 mm) brings some parasitic inductance and capacitance to the device, which will impact RF performance. For compact module, high density multiple channel (e.g., four channels for 100 G and 400 G) array devices are very common. Currently, the array channel pitch is large (e.g., 750 um) that cause the center channel bonding wire becomes extremely long especially when there have some other components such as passive waveguide.

SUMMARY

This section highlights certain features of the inventive concept of the present disclosure, and in no way is to be interpreted as limiting the scope of the claimed subject matter as well as any deviations and derivatives thereof.

In one aspect, a photonic device may include the following: a SOI substrate with a BOX layer therein, an avalanche photodiode integrated with the SOI substrate, a capacitor integrated with the SOI substrate, a resistor integrated with the SOI substrate, one or more silicon passive waveguides, and one or more bonding pads integrated with the SOI substrate.

In one aspect, a photonic device may include the following: a SOI substrate with a BOX layer therein, an avalanche photodiode integrated with the SOI substrate, a capacitor integrated with the SOI substrate, a resistor integrated with the SOI substrate, and one or more bonding pads integrated with the SOI substrate.

In another aspect, a method of manufacturing a photonic device may involve the following: providing a SOI substrate with a BOX layer therein; etching the SOI substrate to the BOX layer to form a Si waveguide; implanting an implant region of the SOI substrate with n-type dopants to form a heavily-doped n-type contact layer; depositing a thick oxide layer on the heavily-doped n-type contact layer; performing chemical mechanical polishing (CMP) on the thick oxide layer; etching an oxide region above the heavily-doped n-type contact layer and selectively depositing an intrinsic Si layer in the implant region; implanting the selectively deposited intrinsic Si layer with n-type dopants to form an n-type Si layer; depositing an intrinsic Si multiplication layer; implanting the intrinsic Si multiplication layer with p-type dopants to form a p-type Si charge layer; depositing an intrinsic Ge layer; depositing an intrinsic amorphous Si layer; implanting the intrinsic amorphous Si layer with p-type dopants to form a heavily-doped p-type contact layer; performing silicide formation, oxide deposition, CMP, via opening, tungsten deposition, and metallization; depositing a Si nitride layer and etching the Si nitride layer to form a dielectric layer functioning as a capacitor dielectric; performing oxide deposition, CMP, via opening, tungsten deposition, and metallization; and depositing one or more passivation layers.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Example Embodiments

Figure 1:
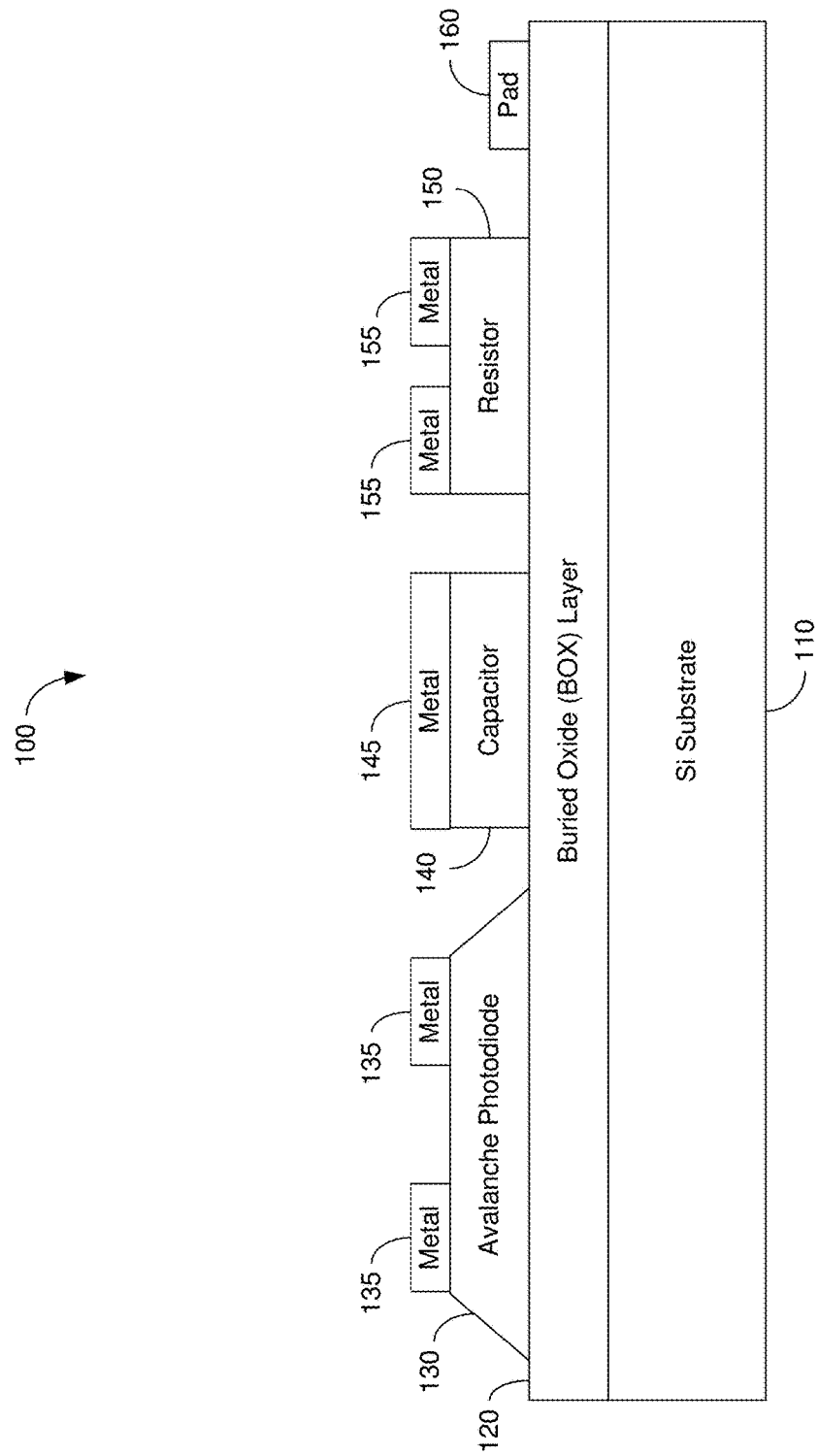
FIG. 1 is a schematic diagram of a fully integrated avalanche photodiode in accordance with an embodiment of the present disclosure.

FIG. 1 illustrates a fully integrated avalanche photodiode 100 in accordance with an embodiment of the present disclosure. Referring to FIG. 1, the fully integrated avalanche photodiode 100 may include a silicon-on-insulator (SOI) substrate having a silicon (Si) substrate 110 and a buried oxide (BOX) layer 120 disposed on Si substrate 110. The fully integrated avalanche photodiode 100 may also include an avalanche photodiode 130, a capacitor 140, a resistor 150, and bonding pads 160. The avalanche photodiode 130 may include, for example and without limitation, a germanium (Ge) on Si avalanche photodiode, and may be monolithically integrated on the SOI substrate. The capacitor 140 may include, for example and without limitation, a metal dielectric capacitor, and may be integrated on the SOI substrate. The resistor 150 may include, for example and without limitation, a doped silicon resistor, and may be integrated on the SOI substrate. The bonding pads 160 may include, for example and without limitation, an aluminum pad, and may be integrated on the SOI substrate. Moreover, each of avalanche photodiode 130, capacitor 140 and resistor 150 may have a metal layer deposited thereon. For instance, a metal layer 135 may be disposed on avalanche photodiode 130, a metal layer 145 may be disposed on capacitor 140, and a metal layer 155 may be disposed on resistor 150.

Figure 2:
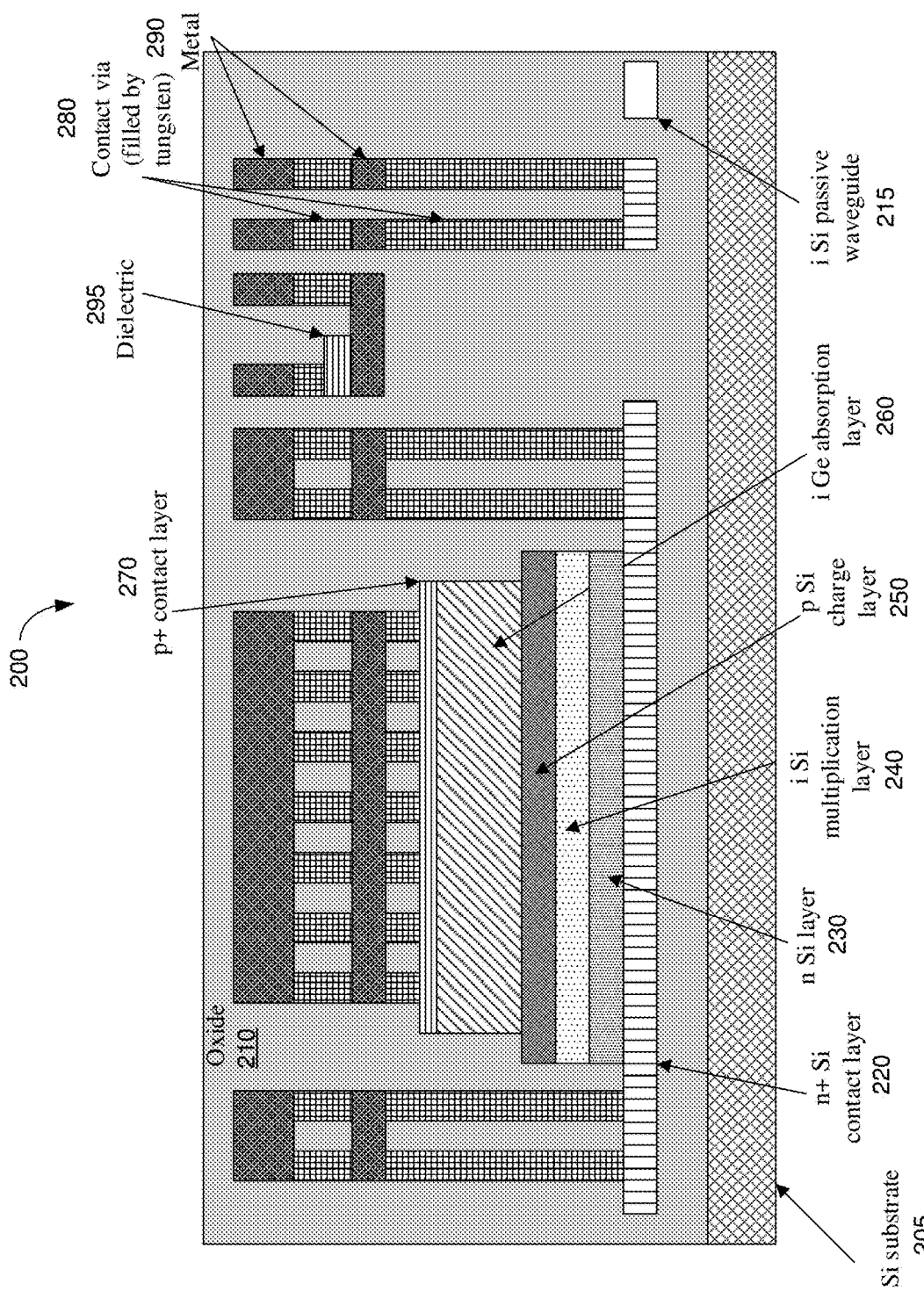
FIG. 2 is a cross-sectional view of a fully integrated avalanche photodiode in accordance with an embodiment of the present disclosure.

FIG. 2 illustrates a fully integrated avalanche photodiode 200 in accordance with an embodiment of the present disclosure. Referring to FIG. 2, the fully integrated avalanche photodiode 200 may include a SOI substrate, which may include a Si substrate 205 and an oxide layer 210 (e.g., a BOX layer) deposited thereon. The fully integrated avalanche photodiode 200 may also include a Si waveguide (WG) 215, a heavily-doped n-type (n+) Si contact layer 220, an n-type Si layer 230, an intrinsic Si multiplication layer 240, a p-type Si charge layer 250, an intrinsic Ge absorption layer 260, a heavily-doped p-type (p+) contact layer 270, a number of contact vias 280, metal layers 290, and a dielectric layer 295.

The Si waveguide 215 and n+ Si contact layer 220 may be disposed above Si substrate 205 of the SOI substrate, and may be composed of intrinsic or heavily n doped Si. The n-type Si layer 230 may be disposed above the n+ Si contact layer 220, and may be composed of n-type Si. The intrinsic Si multiplication layer 240 may be disposed above the n-type Si layer 230, and may be composed of intrinsic Si. The p-type Si charge layer 250 may be disposed above the intrinsic Si multiplication layer 240, and may be composed by lightly p-type Si. The intrinsic Ge absorption layer 260 may be disposed above the p-type Si charge layer 250, and may be composed of intrinsic Ge. The p+ contact layer 270 may be disposed above the intrinsic Ge absorption layer 260, and may be composed of heavily p doped amorphous Si. The contact vias 280 may be disposed above the p+ contact layer 270 and the n+Si contact layer 220, and may include silicon oxide vias that are filled with tungsten. Each of the metal layers 290 may be disposed above a respective one of the contact vias 280, and may be composed of aluminum (Al) alloy. The dielectric layer 295 may be disposed on one of the metal layers 290 and between the respective metal layer 290 and a respective one of the contact vias 280. The Si waveguide 215 may include one or more intrinsic silicon passive waveguides which may be constructed of various structures such as, for example and without limitation, at least an edge coupler, a grating coupler, an optical de-multiplexer, a polarization rotator, and a polarization splitter.

The fully integrated avalanche photodiode 200 may be an example implementation of the fully integrated avalanche photodiode 100. For example, referring to FIG. 1 and FIG. 2, capacitor 140 may be implemented in the fully integrated avalanche photodiode 200 by the combination of the SOI substrate, at least one of the metal layers 290 as capacitor electrode(s), the dielectric layer 295, and at least one of the contact vias 280. In this implementation, the dielectric layer 295 may include, for example and without limitation, silicon nitride. Moreover, the contact vias 280 may be disposed above the dielectric layer 295 and the at least one metal layer 290, and may include, for example and without limitation, a silicon oxide via that is filled with tungsten.

Additionally, referring to FIG. 1 and FIG. 2, resistor 150 may be implemented in the fully integrated avalanche photodiode 200 by the combination of the SOI substrate, at least one of the metal layers 290 as resistor electrode(s), the n+ Si contact layer 220, and at least one of the contact vias 280. The n+ Si contact layer 220 may function to provide electrical resistance, and may be composed of heavily-doped Si. The at least one contact vias 280 may be disposed above the dielectric layer 295 and at least one of the metal layers 290, and may include, for example and without limitation, a silicon oxide via that is filled with tungsten.

In some embodiments, a thickness of the p+ contact layer 270 may be in a range from 50 nm to 200 nm, with a doping concentration in a range between $3e18/cm^3$ and $3e19/cm^3$.

In some embodiments, a thickness of the intrinsic Ge absorption layer 260 may be in a range from 300 nm to 800 nm, with a concentration of intrinsic carriers in a range between $1e14/cm^3$ and $1e16/cm^3$.

In some embodiments, a thickness of the p-type charge layer 250 may be in a range from 50 nm to 300 nm, with a concentration of intrinsic carriers in a range between $1e17/cm^3$ and $2e18/cm^3$.

In some embodiments, a thickness of the intrinsic Si multiplication layer 240 may be in a range from 100 nm to 600 nm, with a concentration of intrinsic carriers in a range between $5e13/cm^3$ and $5e16/cm^3$.

In some embodiments, a thickness of the n-type Si layer 230 may be in a range from 100 nm to 500 nm, with a concentration of intrinsic carriers in a range between $5e17/cm^3$ and $5e18/cm^3$.

In some embodiments, a thickness of the n+ Si contact layer 220 may be in a range from 100 nm to 500 nm, with a doping concentration in a range between $3e18/cm^3$ and $3e19/cm^3$.

In some embodiments, a thickness of the heavily-doped n-type Si contact layer may be in a range from 100 nm to 500 nm, with a doping concentration in a range between $3e18/cm^3$ and $3e19/cm^3$.

In some embodiments, a thickness of the buried oxide layer 210 may be in a range from 1000 nm to 4000 nm.

In some embodiments, a thickness of the dielectric layer 295 of capacitor 140 may be in a range from 20 nm to 100 nm.

In some embodiments, a resistivity of the resistor 150 may be in a range from 20 Ohm/sq to 2000 Ohm/sq.

Figure 3:
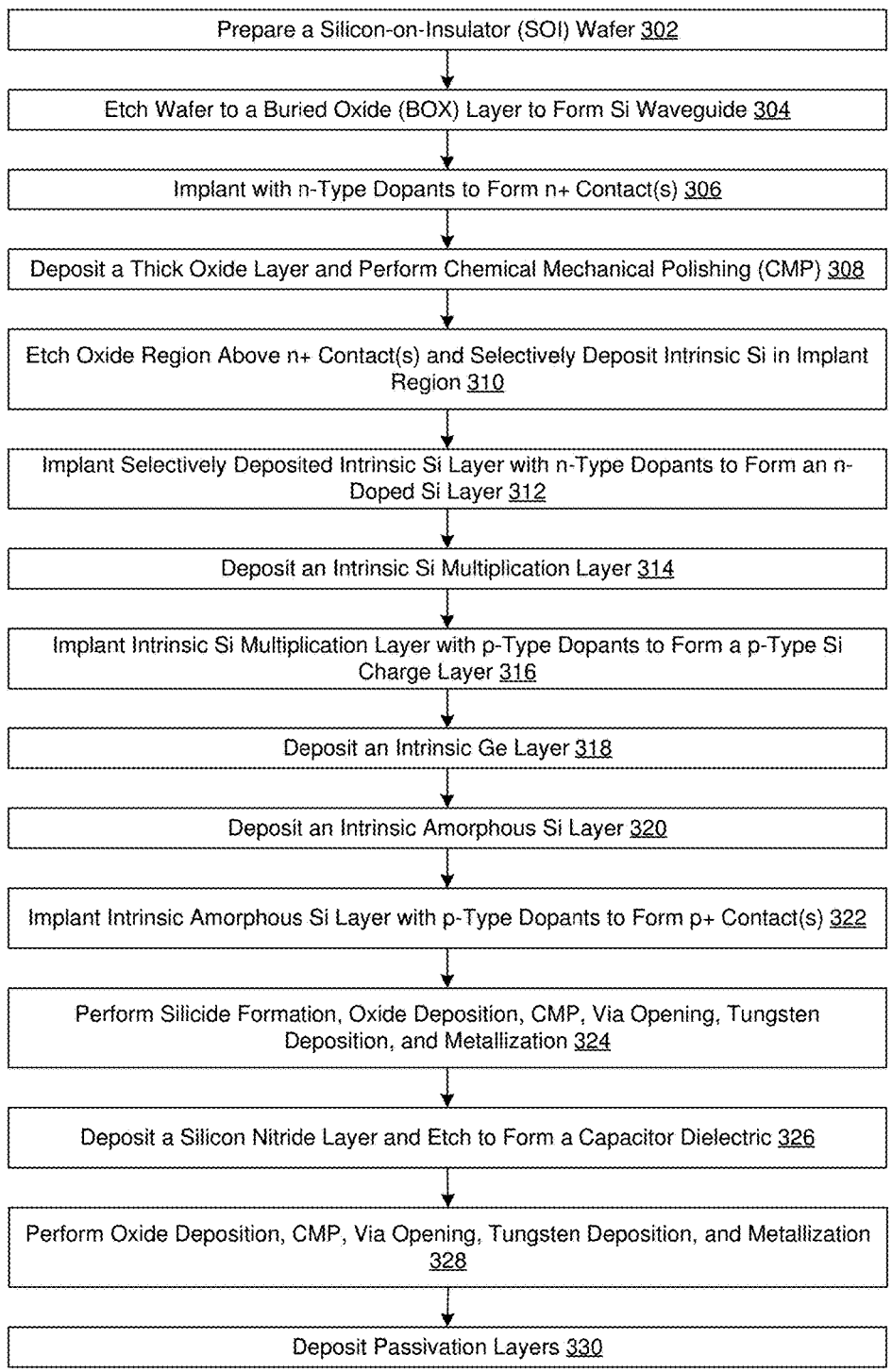
FIG. 3 is a flowchart of a process of manufacturing of a fully integrated avalanche photodiode receiver in accordance with an embodiment of the present disclosure.
Figure 4:
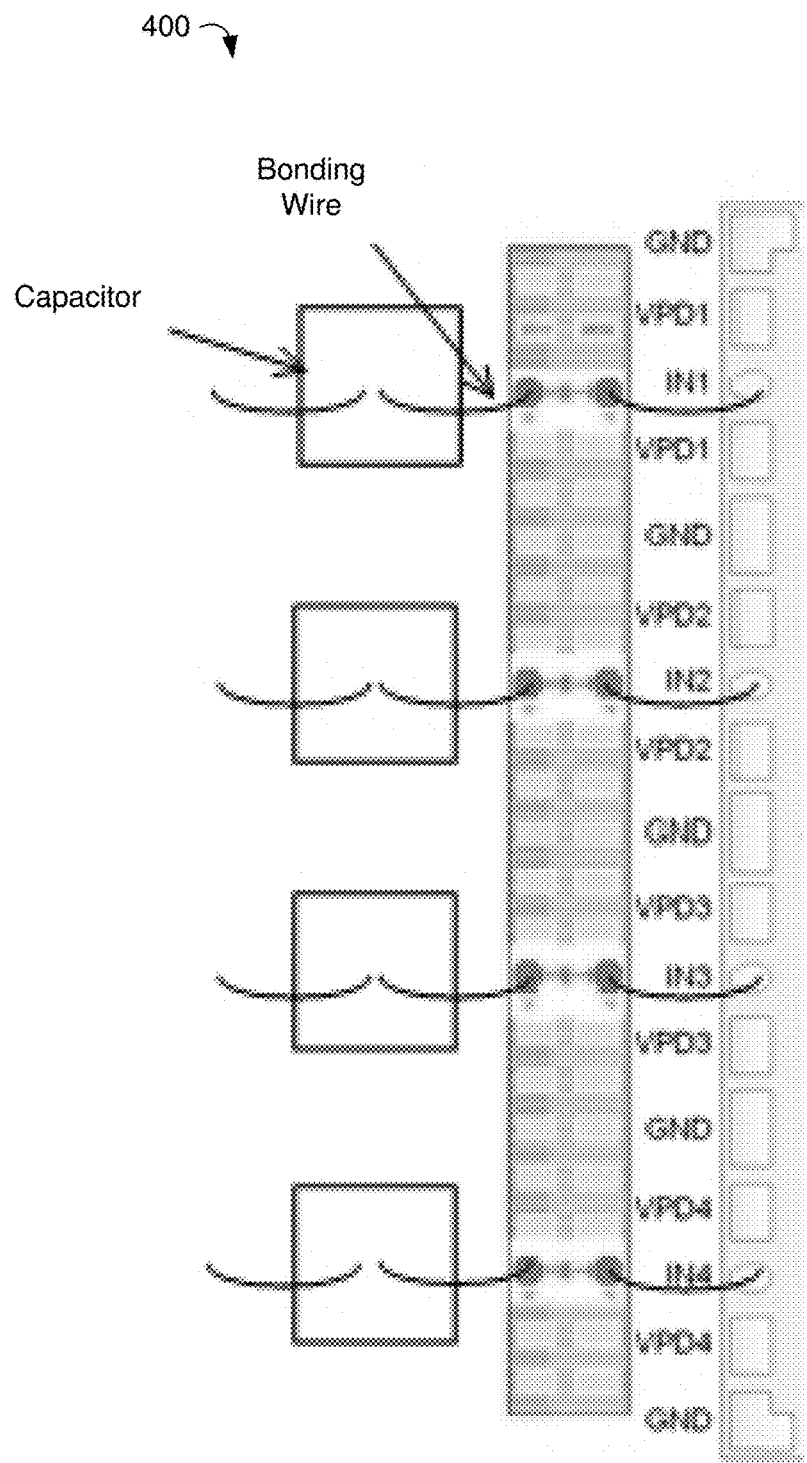
FIG. 4 is a diagram showing wire bonding of a conventional avalanche photodiode device.

FIG. 3 illustrates a process 300 of manufacturing of a fully integrated avalanche photodiode receiver (e.g., fully integrated avalanche photodiode 100 and/or 200) in accordance with an embodiment of the present disclosure. Process 300 may include those operations, actions and/or steps shown in FIG. 3, as well as any additional operations, actions and/or steps. Moreover, the operations, actions and/or steps of process 300 may be executed in the order shown in FIG. 3 or, alternatively, in another order different from that shown in FIG. 3. Process 300 may begin at 302.

At 302, process 300 may involve preparing a silicon-on-insulator (SOI) wafer. Process 300 may proceed from 302 to 304.

At 304, process 300 may involve etching the SOI wafer to a buried oxide (BOX) layer to form a Si waveguide 215. Process 300 may proceed from 304 to 306.

At 306, process 300 may involve implanting the SOI substrate with n-type dopants to form n+ contact(s). Process 300 may proceed from 306 to 308.

At 308, process 300 may involve depositing a thick oxide layer and performing chemical mechanical polishing (CMP) on the structure. Process 300 may proceed from 308 to 310.

At 310, process 300 may involve etching an oxide region above the n+ contact(s) and selectively depositing intrinsic Si in the implant region. Process 300 may proceed from 310 to 312.

At 312, process 300 may involve implanting the selectively deposited intrinsic Si layer with n-type dopants to form an n-type Si layer. Process 300 may proceed from 312 to 314.

At 314, process 300 may involve depositing an intrinsic Si multiplication layer. Process 300 may proceed from 314 to 316.

At 316, process 300 may involve implanting the intrinsic Si multiplication layer with p-type dopants to form a p-type Si charge layer. Process 300 may proceed from 316 to 318.

At 318, process 300 may involve depositing an intrinsic Ge layer. Process 300 may proceed from 318 to 320.

At 320, process 300 may involve depositing an intrinsic amorphous Si layer. Process 300 may proceed from 320 to 322.

At 322, process 300 may involve implanting the intrinsic amorphous Si layer with p-type dopants to form p+ contact(s). Process 300 may proceed from 322 to 324.

At 324, process 300 may involve performing silicide formation, oxide deposition, CMP, via opening, tungsten deposition, and metallization. Process 300 may proceed from 324 to 326.

At 326, process 300 may involve depositing a silicon nitride layer and etching to form a capacitor dielectric layer. Process 300 may proceed from 326 to 328.

At 328, process 300 may involve performing oxide deposition, CMP, via opening, tungsten deposition, and metallization. Process 300 may proceed from 328 to 330.

At 330, process 300 may involve depositing one or more passivation layers.

Highlight of Select Features

In one aspect, a photonic device may include the following: a SOI substrate with a BOX layer therein, an avalanche photodiode integrated with the SOI substrate, a capacitor integrated with the SOI substrate, a resistor integrated with the SOI substrate, one or more intrinsic silicon passive waveguides, and one or more bonding pads integrated with the SOI substrate.

In some embodiments, a thickness of the BOX layer may be in a range from 1000 nm to 4000 nm.

In some embodiments, the bond pad may include an aluminum pad.

In some embodiments, the avalanche photodiode may include the following: the SOI substrate, one or more intrinsic silicon passive waveguides and a heavily n-type Si contact layer disposed over the BOX layer of the SOI substrate, an n-type Si layer disposed over the heavily n-type Si contact layer, an intrinsic Si multiplication layer disposed over the n-type Si layer, a p-type Si charge layer disposed over the intrinsic Si multiplication layer, an intrinsic Ge absorption layer disposed over the p-type Si charge layer, a heavily-doped p-type contact layer disposed over the intrinsic Ge absorption layer, one or more contact vias formed on the heavily-doped p-type contact layer, the one or more contact vias filled with tungsten, and a metal layer disposed over the one or more contact vias.

In some embodiments, the metal layer may include an aluminum alloy.

In some embodiments, a thickness of the heavily-doped p-type contact layer may be in a range from 50 nm to 200 nm, with a doping concentration in a range between $3e18/cm^3$ and $3e19/cm^3$.

In some embodiments, a thickness of the intrinsic Ge absorption layer may be in a range from 300 nm to 800 nm, with a concentration of intrinsic carriers in a range between $1e14/cm^3$ and $1e16/cm^3$.

In some embodiments, a thickness of the p-type Si charge layer may be in a range from 50 nm to 300 nm, with a concentration of intrinsic carriers in a range between $1e17/cm^3$ and $2e18/cm^3$.

In some embodiments, a thickness of the intrinsic Si multiplication layer may be in a range from 100 nm to 600 nm, with a concentration of intrinsic carriers in a range between $5e13/cm^3$ and $5e16/cm^3$.

In some embodiments, a thickness of the n-type Si layer may be in a range from 100 nm to 500 nm, with a concentration of intrinsic carriers in a range between $5e17/cm^3$ and $5e18/cm^3$.

In some embodiments, the capacitor may include the following: the SOI substrate, a metal layer functioning as a capacitor electrode, a dielectric layer, and one or more contact vias formed for connecting the dielectric layer and the metal layer, with the one or more contact vias filled with tungsten.

In some embodiments, the dielectric layer may include silicon nitride.

In some embodiments, the one or more contact vias may include a silicon oxide via.

In some embodiments, a thickness of the dielectric layer of the capacitor may be in a range from 20 nm to 100 nm.

In some embodiments, the resistor may include the following: the SOI substrate, a metal layer functioning as a resistor electrode, a heavily-doped n-type Si contact layer, and one or more contact vias formed for connecting the heavily-doped n-type Si layer and the metal layer, with the one or more contact via filled with tungsten.

In some embodiments, the one or more contact vias may include a silicon oxide via.

In some embodiments, a thickness of the heavily-doped n-type Si contact layer may be in a range from 100 nm to 500 nm, with a doping concentration in a range between $3e18/cm^3$ and $3e19/cm^3$.

In some embodiments, a resistivity of the resistor may be in a range from 20 Ohm/sq to 2000 Ohm/sq.

In some embodiments, the one or more intrinsic silicon passive waveguides may include various structures such as, for example and without limitation, at least an edge coupler, a grating coupler, an optical de-multiplexer, a polarization rotator, and a polarization splitter.

In one aspect, a photonic device may include the following: a SOI substrate with a BOX layer therein, an avalanche photodiode integrated with the SOI substrate, a capacitor integrated with the SOI substrate, a resistor integrated with the SOI substrate, and one or more bonding pads integrated with the SOI substrate.

In another aspect, a method of manufacturing a photonic device may involve the following: providing a SOI substrate with a BOX layer therein; etching the SOI substrate to the BOX layer to form a Si waveguide; implanting an implant region of the SOI substrate with n-type dopants to form a heavily-doped n-type contact layer; depositing a thick oxide layer on the heavily-doped n-type contact layer; performing chemical mechanical polishing (CMP) on the thick oxide layer; etching an oxide region above the heavily-doped n-type contact layer and selectively depositing an intrinsic Si layer in the implant region; implanting the selectively deposited intrinsic Si layer with n-type dopants to form an n-type Si layer; depositing an intrinsic Si multiplication layer; implanting the intrinsic Si multiplication layer with p-type dopants to form a p-type Si charge layer; depositing an intrinsic Ge layer; depositing an intrinsic amorphous Si layer; implanting the intrinsic amorphous Si layer with p-type dopants to form a heavily-doped p-type contact layer; performing silicide formation, oxide deposition, CMP, via opening, tungsten deposition, and metallization; depositing a Si nitride layer and etching the Si nitride layer to form a dielectric layer functioning as a capacitor dielectric; performing oxide deposition, CMP, via opening, tungsten deposition, and metallization; and depositing one or more passivation layers.

In some embodiments, a thickness of the BOX layer is in a range from 1000 nm to 4000 nm; a thickness of the heavily-doped p-type contact layer is in a range from 50 nm to 200 nm, with a doping concentration in a range between $3e18/cm^3$ and $3e19/cm^3$; a thickness of the intrinsic Ge absorption layer is in a range from 300 nm to 800 nm, with a concentration of intrinsic carriers in a range between $1e14/cm^3$ and $1e16/cm^3$; a thickness of the p-type Si charge layer is in a range from 50 nm to 300 nm, with a concentration of intrinsic carriers in a range between $1e17/cm^3$ and $2e18/cm^3$; a thickness of the intrinsic Si multiplication layer is in a range from 100 nm to 600 nm, with a concentration of intrinsic carriers in a range between $5e13/cm^3$ and $5e16/cm^3$; a thickness of the n-type Si layer is in a range from 100 nm to 500 nm, with a concentration of intrinsic carriers in a range between $5e17/cm^3$ and $5e18/cm^3$; a thickness of the heavily-doped n-type Si contact layer is in a range from 100 nm to 500 nm, with a doping concentration in a range between $3e18/cm^3$ and $3e19/cm^3$; and a thickness of the dielectric layer of the capacitor is in a range from 20 nm to 100 nm.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A photonic device, comprising:
    a silicon on insulator (SOI) substrate with a buried oxide (BOX) layer therein;
    an avalanche photodiode integrated with the SOI substrate;
    a capacitor integrated with the SOI substrate;
    a resistor integrated with the SOI substrate;
    one or more silicon passive waveguides; and
    one or more bonding pads integrated with the SOI substrate,
    wherein the avalanche photodiode comprises:
        the SOI substrate;
        a silicon (Si) waveguide and a heavily n-type Si contact layer disposed over the BOX layer of the SOI substrate;
        an n-type Si layer disposed over the heavily n-type Si contact layer;
        an intrinsic Si multiplication layer disposed over the n-type Si layer;
        a p-type Si charge layer disposed over the intrinsic Si multiplication layer;
        an intrinsic germanium (Ge) absorption layer disposed over the p-type Si charge layer;
        a heavily-doped p-type contact layer disposed over the intrinsic Ge absorption layer;
        one or more contact vias formed on the heavily-doped p-type contact layer, the one or more contact vias filled with tungsten; and
        a metal layer disposed over the one or more contact vias.

2. The photonic device of claim 1, wherein the metal layer comprises an aluminum alloy.

3. The photonic device of claim 1, wherein a thickness of the heavily-doped p-type contact layer is in a range from 50 nm to 200 nm, with a doping concentration in a range between $3e18/cm^3$ and $3e19/cm^3$.

4. The photonic device of claim 1, wherein a thickness of the intrinsic Ge absorption layer is in a range from 300 nm to 800 nm, with a concentration of intrinsic carriers in a range between $1e14/cm^3$ and $1e16/cm^3$.

5. The photonic device of claim 1, wherein a thickness of the p-type Si charge layer is in a range from 50 nm to 300 nm, with a concentration of intrinsic carriers in a range between $1e17/cm^3$ and $2e18/cm^3$.

6. The photonic device of claim 1, wherein a thickness of the intrinsic Si multiplication layer is in a range from 100 nm to 600 nm, with a concentration of intrinsic carriers in a range between $5e13/cm^3$ and $5e16/cm^3$.

7. The photonic device of claim 1, wherein a thickness of the n-type Si layer is in a range from 100 nm to 500 nm, with a concentration of intrinsic carriers in a range between $5e17/cm^3$ and $5e18/cm^3$.

8. The photonic device of claim 1, wherein a thickness of the heavily-doped n-type Si contact layer is in a range from 100 nm to 500 nm, with a doping concentration in a range between $3e18/cm^3$ and $3e19/cm^3$.

9. The photonic device of claim 1, wherein a thickness of the BOX layer is in a range from 1000 nm to 4000 nm, and wherein the bond pad comprises an aluminum pad.

10. A photonic device, comprising:
    a silicon on insulator (SOI) substrate with a buried oxide (BOX) layer therein;
    an avalanche photodiode integrated with the SOI substrate;
    a capacitor integrated with the SOI substrate;
    a resistor integrated with the SOI substrate;
    one or more silicon passive waveguides; and
    one or more bonding pads integrated with the SOI substrate,
    wherein the capacitor comprises:
        the SOI substrate;
        a metal layer functioning as a capacitor electrode;
        a dielectric layer; and
        one or more contact vias connecting the dielectric layer and the metal layer, the one or more contact vias filled with tungsten.

11. The photonic device of claim 10, wherein the dielectric layer comprises silicon nitride.

12. The photonic device of claim 10, wherein the one or more contact vias comprise silicon oxide via.

13. The photonic device of claim 10, wherein a thickness of the dielectric layer of the capacitor is in a range from 20 nm to 100 nm.

14. A photonic device, comprising:
    a silicon on insulator (SOI) substrate with a buried oxide (BOX) layer therein;
    an avalanche photodiode integrated with the SOI substrate;
    a capacitor integrated with the SOI substrate;
    a resistor integrated with the SOI substrate;
    one or more silicon passive waveguides; and
    one or more bonding pads integrated with the SOI substrate,
    wherein the resistor comprises:
        the SOI substrate;
        a metal layer functioning as a resistor electrode;
        a heavily-doped n-type Si contact layer; and
        one or more contact vias connecting the heavily-doped n-type Si layer and the metal layer, the one or more contact vias filled with tungsten.

15. The photonic device of claim 14, wherein the one or more contact vias comprise silicon oxide via.

16. The photonic device of claim 14, wherein a thickness of the heavily-doped n-type Si contact layer is in a range from 100 nm to 500 nm, with a doping concentration in a range between $3e18/cm^3$ and $3e19/cm^3$.

17. The photonic device of claim 14, wherein a resistivity of the resistor is in a range from 20 Ohm/sq to 2000 Ohm/sq.

18. The photonic device of claim 1, wherein the one or more silicon passive waveguides comprise various structures comprising at least an edge coupler, a grating coupler, an optical de-multiplexer, a polarization rotator, and a polarization splitter, wherein a thickness of the one or more silicon passive waveguides is in a range from 100 nm to 500 nm.

19. A photonic device, comprising:
 a silicon on insulator (SOI) substrate with a buried oxide (BOX) layer therein;
 an avalanche photodiode integrated with the SOI substrate;
 a capacitor integrated with the SOI substrate;
 a resistor integrated with the SOI substrate; and
 one or more bonding pads integrated with the SOI substrate,
wherein either:
 the capacitor comprises:
  the SOI substrate;
  a metal layer functioning as a capacitor electrode;
  a dielectric layer; and
  one or more contact vias connecting the dielectric layer and the metal layer, the one or more contact vias filled with tungsten, or
 the resistor comprises:
  the SOI substrate;
  a metal layer functioning as a resistor electrode;
  a heavily-doped n-type Si contact layer; and
  one or more contact vias connecting the heavily-doped n-type Si layer and the metal layer, the one or more contact vias filled with tungsten.

* * * * *